United States Patent
Hartmann et al.

(10) Patent No.: US 9,357,672 B2
(45) Date of Patent: May 31, 2016

(54) AIR GUIDANCE SYSTEM

(75) Inventors: Reiner Hartmann, Wettenberg (DE); Stefan Schneider, Bad Endbach (DE); Claudia Christine Ronzheimer, Asslar (DE)

(73) Assignee: Rittal GmbH & Co. KG, Herborn (DE)

( * ) Notice: Subject to any disclaimer, the term of this patent is extended or adjusted under 35 U.S.C. 154(b) by 33 days.

(21) Appl. No.: 13/261,474

(22) PCT Filed: Mar. 15, 2011

(86) PCT No.: PCT/EP2011/053900
§ 371 (c)(1),
(2), (4) Date: Oct. 15, 2012

(87) PCT Pub. No.: WO2011/131426
PCT Pub. Date: Oct. 27, 2011

(65) Prior Publication Data
US 2013/0029581 A1    Jan. 31, 2013

(30) Foreign Application Priority Data

Apr. 19, 2010  (DE) .......................... 10 2010 016 507

(51) Int. Cl.
| | |
|---|---|
| *F24F 13/28* | (2006.01) |
| *H05K 7/20* | (2006.01) |
| *F04D 29/64* | (2006.01) |
| *F04D 29/70* | (2006.01) |
| *H05K 5/02* | (2006.01) |

(52) U.S. Cl.
CPC .......... *H05K 7/20181* (2013.01); *F04D 29/646* (2013.01); *F04D 29/703* (2013.01); *H05K 5/0221* (2013.01)

(58) Field of Classification Search
CPC ...... F24F 13/084; E05C 19/14; E05C 19/022; E05C 1/06; E05C 1/085; E05C 3/14; E05C 3/16; F04D 29/646; F04D 29/703; H05K 7/20181; H05K 5/0221
USPC .............. 454/283, 184; 292/60–62, 180, 181, 292/256.75; 16/110.1, 406, 408, 425
See application file for complete search history.

(56) References Cited

U.S. PATENT DOCUMENTS

| | | | | |
|---|---|---|---|---|
| 4,527,821 | A | * | 7/1985 | Tanaka ............................. 292/19 |
| 5,301,989 | A | * | 4/1994 | Dallmann et al. ............. 292/142 |
| 6,109,669 | A | * | 8/2000 | Pinkow .......................... 292/175 |

(Continued)

FOREIGN PATENT DOCUMENTS

| | | |
|---|---|---|
| DE | 35 32 169 A1 | 4/1987 |
| DE | 200 06 849 U1 | 8/2000 |

(Continued)

*Primary Examiner* — Steven B McAllister
*Assistant Examiner* — Steven Anderson, II
(74) *Attorney, Agent, or Firm* — Marshall & Melhorn, LLC

(57) ABSTRACT

The invention relates to an air guidance system having an air guidance housing and an air passage grating fastened thereto, the air passage grating being held on the air guidance housing by means of a snap-lock connection. In order to simplify maintenance of such an air guidance system it is provided according to the invention that the air passage grating carries at least one latch having a snap-in shoulder that can be engaged in a snap-lock seat of the air passage grating and that the air passage grating pivotally accommodates a handle in a bearing seat, said handle disengaging the latch from the snap-lock seat when set from the locking position to the unlocking position.

4 Claims, 7 Drawing Sheets

(56) References Cited

U.S. PATENT DOCUMENTS

| | | |
|---|---|---|
| 6,213,819 B1 | 4/2001 | Fan |
| 6,267,793 B1 * | 7/2001 | Gomez et al. ............... 55/385.2 |
| 6,283,512 B1 * | 9/2001 | Butterbaugh et al. .......... 292/87 |
| 6,297,948 B1 * | 10/2001 | Buican et al. ............ 361/679.58 |
| 6,373,690 B1 * | 4/2002 | Buican et al. ............ 361/679.59 |
| 6,373,698 B1 * | 4/2002 | Christensen ................. 361/695 |
| 6,583,991 B1 | 6/2003 | Furuta et al. |
| 6,954,354 B2 | 10/2005 | Shyr |
| 8,020,902 B1 * | 9/2011 | Li ................................... 292/80 |
| 8,287,009 B2 * | 10/2012 | Dane et al. .................... 292/56 |
| 8,605,424 B2 * | 12/2013 | Wallace et al. .......... 361/679.38 |
| 2004/0099669 A1 * | 5/2004 | Lown et al. ................... 220/324 |
| 2004/0117946 A1 * | 6/2004 | Lin et al. ...................... 16/110.1 |
| 2007/0056229 A1 | 3/2007 | Lu |
| 2008/0045135 A1 | 2/2008 | Pfannenberg |
| 2008/0251640 A1 * | 10/2008 | Johnson et al. ............. 244/118.1 |
| 2008/0266780 A1 * | 10/2008 | Olesiewicz et al. ........... 361/685 |
| 2009/0096221 A1 * | 4/2009 | Jan et al. .......................... 292/81 |
| 2010/0012802 A1 * | 1/2010 | Bonshor ................... 248/220.21 |

FOREIGN PATENT DOCUMENTS

| | | |
|---|---|---|
| DE | 20 2006 016 841 U1 | 2/2007 |
| EP | 1 930 665 A1 | 6/2008 |
| JP | 2007005701 * | 1/2007 |
| WO | WO 01/02778 A1 | 1/2001 |
| WO | WO 2011013039 A1 * | 2/2011 |

* cited by examiner

AIR GUIDANCE SYSTEM

BACKGROUND OF THE INVENTION

The invention relates to an air guidance system having an air guidance housing and an air passage grating fastened thereto, the air passage grating being held on the air guidance housing by means of a snap-lock connection.

Air guidance systems of this type are used for switchgear cabinet construction and may be inserted into a cut-out of a switchgear cabinet wall. Often, fan assemblies are combined with the air guidance systems to suck ambient air through the air passage grating and to supply that air to the interior of the switchgear cabinet through the air guidance housing.

Generally, a filter mat is held within the air guidance housing to filter particles from the sucked air. That filter mat must be replaced in regular intervals. To this end, the air passage grating is dismounted from the air guidance housing. The air passage grating is held at the air guidance housing by means of a snap-lock connection. The snap-lock connection is configured such that it may be unlocked only by means of a screwdriver.

SUMMARY OF THE INVENTION

It is the object of the invention to create an air guidance system of the type mentioned in the introductory, where the maintenance staff has access to the interior of the air guidance housing in a simple manner.

That object is solved in that the air guidance housing carries at least one latch having a snap-in shoulder that can be engaged in a snap-lock seat of the air passage grating and that the air passage grating pivotally accommodates a handle in a bearing seat, said handle disengaging the latch from the snap-lock seat when set from the locking position to the unlocking position.

Thus, for maintenance, no separate tool has to be ready for replacing the filter mat, but only the handle must be pivoted to disengage the snap-lock connection. In this way, a time-saving maintenance is possible even where space is at a premium.

According to a preferred variant of the invention, it may be provided that the handle carries two bearing tabs forming a common bearing axis and which, respectively, are engaged in a bearing seat. The common bearing axis forms a stable coupling of the handle to the air passage grating. Since the handle is snapped into the air passage grating, it can be easily joined therewith for the benefit of reduced assembly costs.

A reliable release of the snap-lock connection is possible in a simple way if it is provided that the handle comprises at least one actuator element forming an approach slope which interacts with a slope of the snap-in shoulder for disengaging the snap-in shoulder such that the snap-in shoulder is deflected. When pivoting the handle, the approach slope slides along the slope. Thus, a power reduction is achieved, by which even stable snap-lock connections which are difficult to move may be easily released.

A particularly stable coupling of the air passage grating may be achieved in that two latches are mounted at the air guidance housing which can be disengaged by means of a respective associated actuator element, when operating the handle.

A particularly preferred air guidance system is such that the handle has a press-off piece spaced apart from the pivot axis of the handle and that the press-off piece can be pressed on a press-off face of the air guidance housing for pressing off the air passage grating from the locking position.

On the one hand, when manipulating the handle, the snap-lock connection between the air passage grating and the air guidance housing is released. On the other hand, the handle pushes the disengaged air passage grating someway apart from the air guidance housing by means of the press-off piece, so that it may be grasped conveniently and be opened further.

If it is provided that the handle comprises a stopper abutting at a locking piece of the air passage grating in the unlocking position of the handle, the handle is still securely held at the air passage grating when a service person pulls the handle inadmissibly strong.

A particularly time-saving maintenance of the air guidance system is possible if it is provided that the air passage grating is pivotally coupled to the air guidance housing by means of a hinge connection. Then, the snap-lock connection may be released in a first step by means of the handle. Subsequently, the air passage grating may be folded down in the hinge connection, so that the interior of the air passage housing is accessible. There is no need to put aside the air passage grating since it is still kept in the hinge connection. The service staff may now replace the filter mat and subsequently fold up the air passage grating in the hinge connection, until it reaches its mounting position. The air passage grating locks again in the region of the handle and is thus securely fixed.

BRIEF DESCRIPTION OF THE DRAWINGS

The invention will below be explained in detail with the aid of an exemplary embodiment illustrated in the drawings. It is shown in.

DETAILED DESCRIPTION OF THE INVENTION

Figure 1:
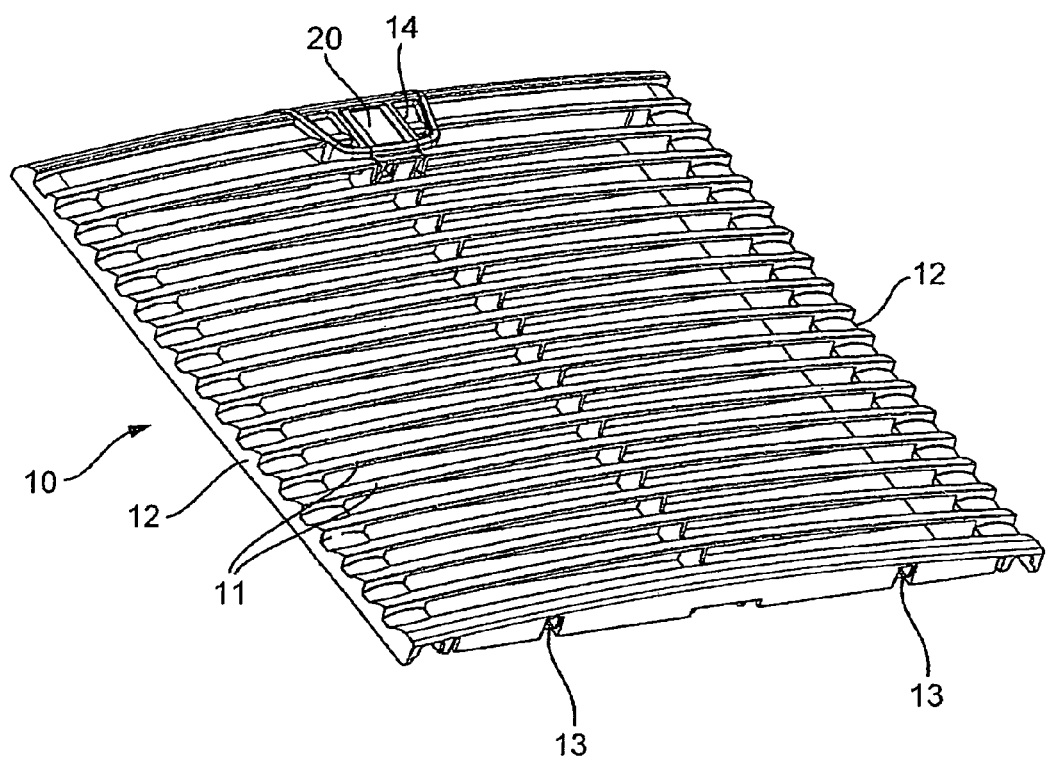
FIG. 1 an air passage grating in a perspective front view.

FIG. 1 shows an air passage grating 10 having a plurality of parallel louvers 11. Louvers 11 are integrally joined by means of bars 12 at their longitudinal ends. In the region of the lower horizontal edge, air passage grating 10 comprises two hinge seats 13 configured to form a horizontal hinge axis. At the upper horizontal edge, air passage grating 10 is equipped with a closure seat 14. A handle 20 is secured within this closure seat 14.

Figure 2:
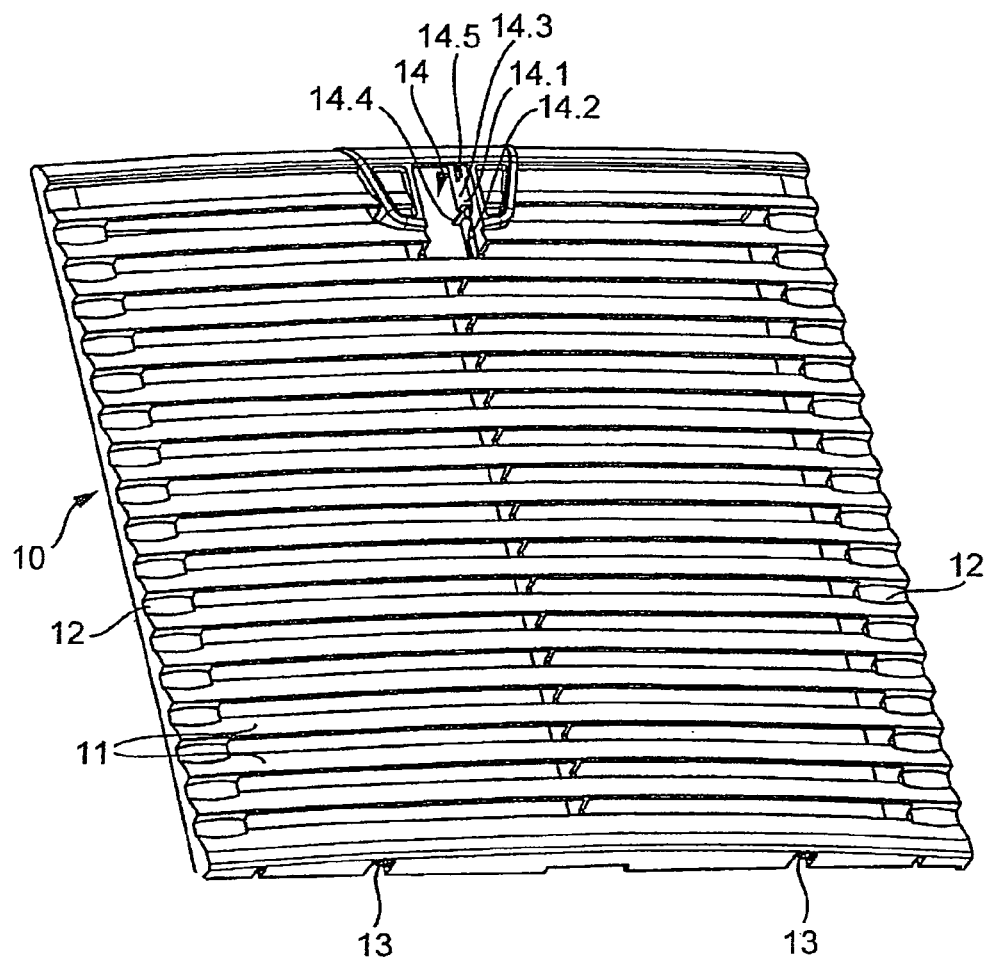
FIG. 2 the illustration according to FIG. 1, but in a modified mounting.
Figure 3:
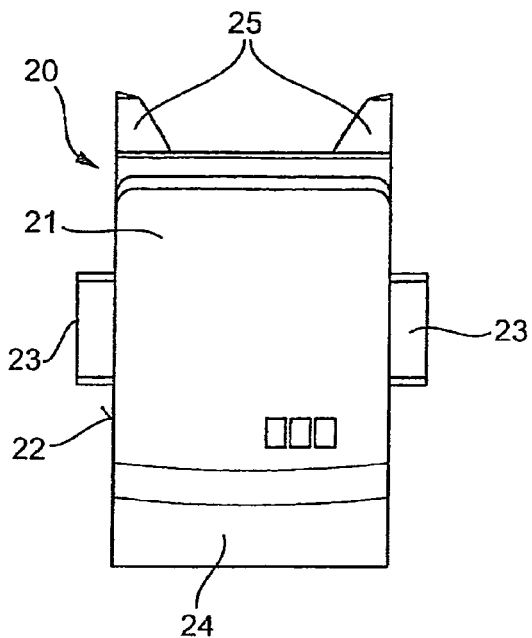
FIGS. 3-6 a handle in several views.
Figure 4:
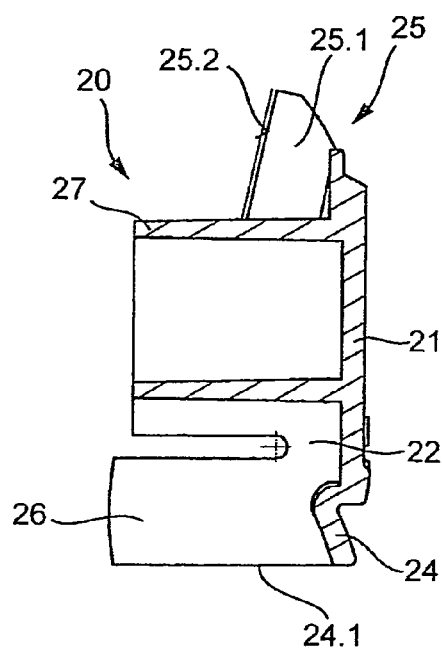

FIG. 2 shows air passage grating 10 of FIG. 1, however, with handle 20 dismounted. As may be recognized from this illustration, air passage grating 10 is provided with an opening in the region of the closure seat 14. The opening is laterally bound by two parallel guiding walls 14.3. Recesses are machined into guiding walls 14.3 forming a bearing seat 14.1. Bearing seats 14.1 comprise an insert section into which a snap-lock element 14.4 is incorporated. Further, each guiding wall 14.3 comprises a snap-lock seat 14.5. A locking piece 14.2 in form of a bar is formed to the lower side of the bearing seat 14.1, wherein the locking pieces 14.2 are facing towards another.

Handle 20, in detail illustrated in FIGS. 3-6, may be mounted within closure seat 14. As is shown in these illustrations, handle 20 is embodied as a one-piece injection molding part. It comprises a plate-shaped front cover 21 to which two parallel sidewalls 22 are formed rectangularly. Sidewalls 22 together with wall sections 27 form a receptacle in which electrical components may be fixed behind front cover 21. For example, a battery or a switching device of a display unit may be incorporated here.

Two lobed tabs are freed from sidewall 22 which form stoppers 26. The two stoppers 26 are interconnected via a handle section 24. In a region between handle section 24 and the two stoppers 26, a handle recess 24.1 is formed.

Figure 5:
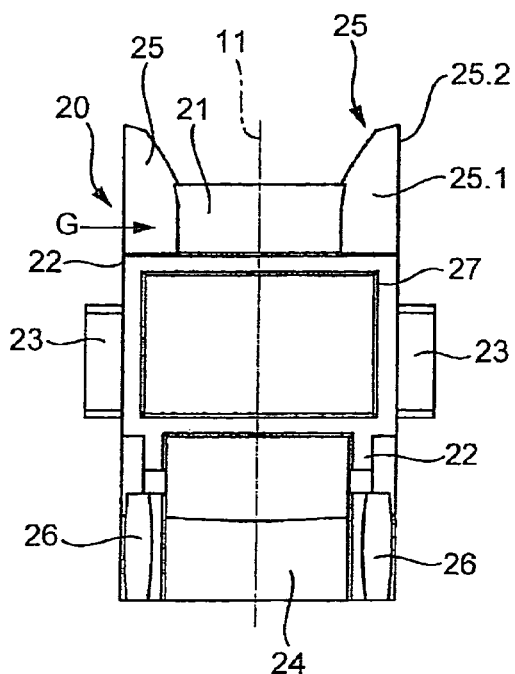
Figure 6:
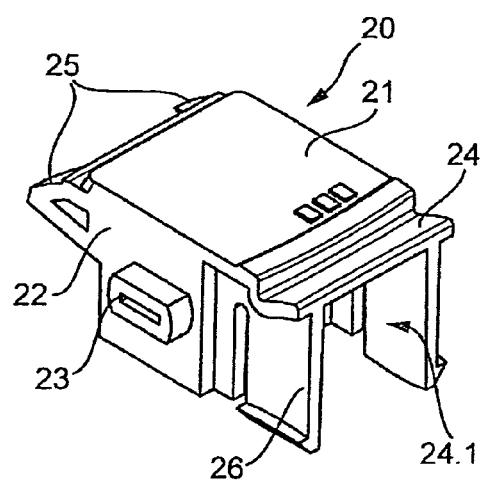

Handle 20 comprises two spaced apart actuator elements 25 on the face facing away from handle section 24. Those actuator elements 25 are formed as protrusions and respectively comprise an inclined approach slope 25.1. Approach slope 25.1 is inclined with respect to the center transverse plane M of handle 20 (see FIG. 5). Approach slope 25.1 tapers starting from the plane defined by sidewall 22 towards front cover 21, as shown in FIG. 5. For better clarification, direction of slope D where approach slope 25.1 declines is characterized in FIG. 5 at the left hand actuator element 25. Each actuator element 25 forms a press-off piece 25.2 in form of a press-off shoulder in extension of sidewall 22.

Air passage grating 10 may be mounted within closure seat 14. To this end, handle 20 is pushed into closure seat 14 from the rear face of the air passage grating 10 with leading front cover 21. Sidewalls 22 slide along guiding walls 14.3. When inserting handle 20, bearing tabs 23 reach the region of snap-lock elements 14.4. Snap-lock elements 14.4 are deflected in opposite directions. When bearing tabs 23 have passed snap-lock elements 14.4 and reach bearing seats 14.1, snap-lock elements 14.4 snap behind bearing tabs 23, so that handle 20 is securely held at air passage grating 10. Then, bearing tabs 23 form a horizontal pivot axis in bearing seats 14.1, around which handle 20 may be pivoted. Starting from the locking position of FIG. 1, handle 20 may be pivoted into an unlocking position. To this end, handle recess 24.1 offers a receptacle for the finger to grasp behind handle section 24. Now, handle 20 may be folded around the pivot axis at handle section 24. Pivoting is limited by stoppers 26, wherein stoppers 26 abut at the locking pieces in a pivoted locking position.

Figure 7:
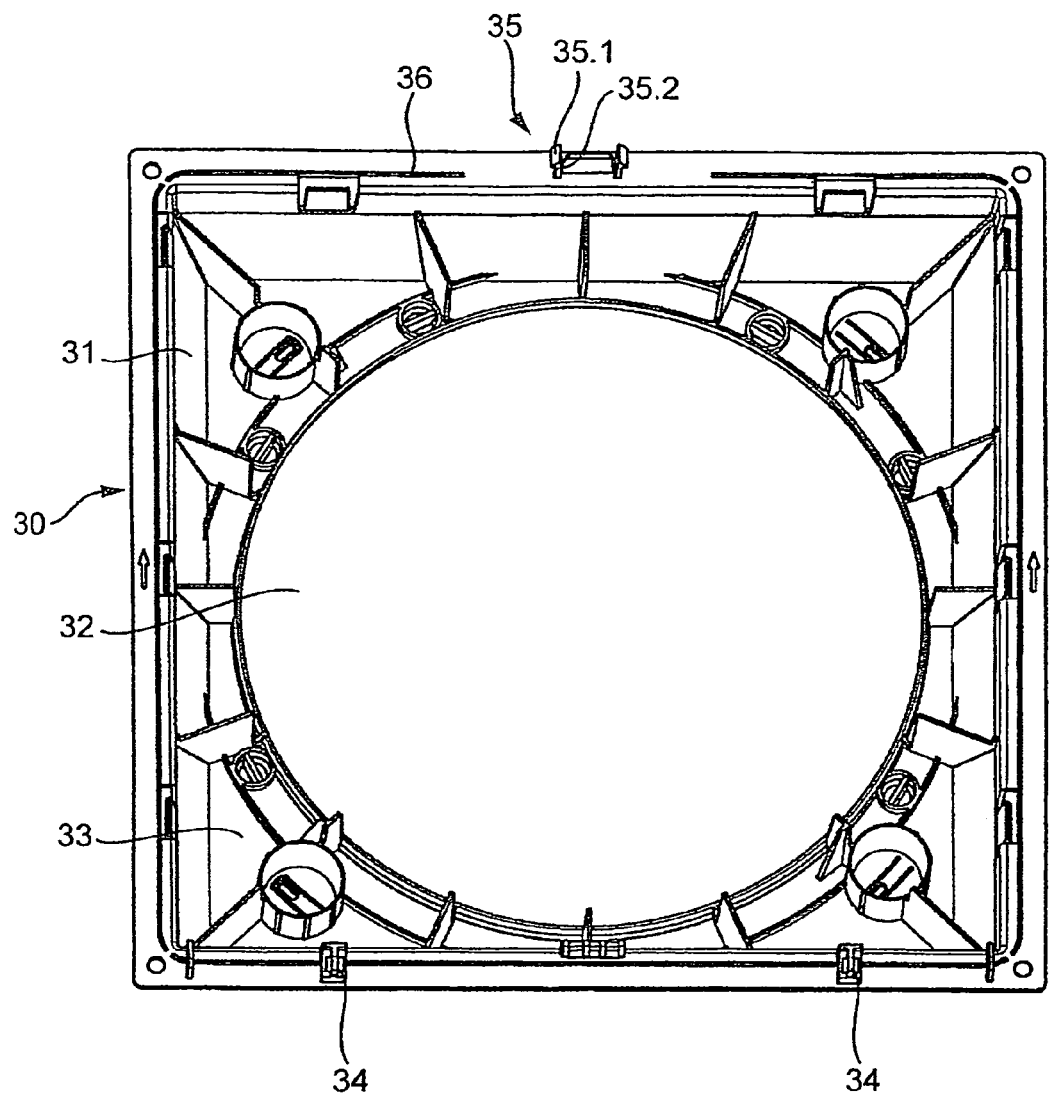
FIG. 7 an air passage housing in a perspective front view.
Figure 8:
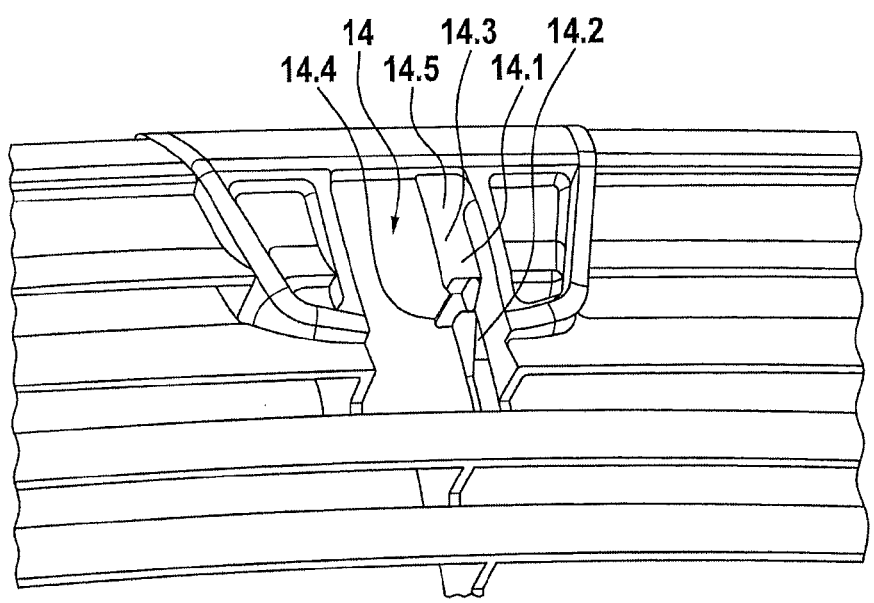
FIG. 8 an enlarged view of the closure seat of FIG. 2.
Figure 9:
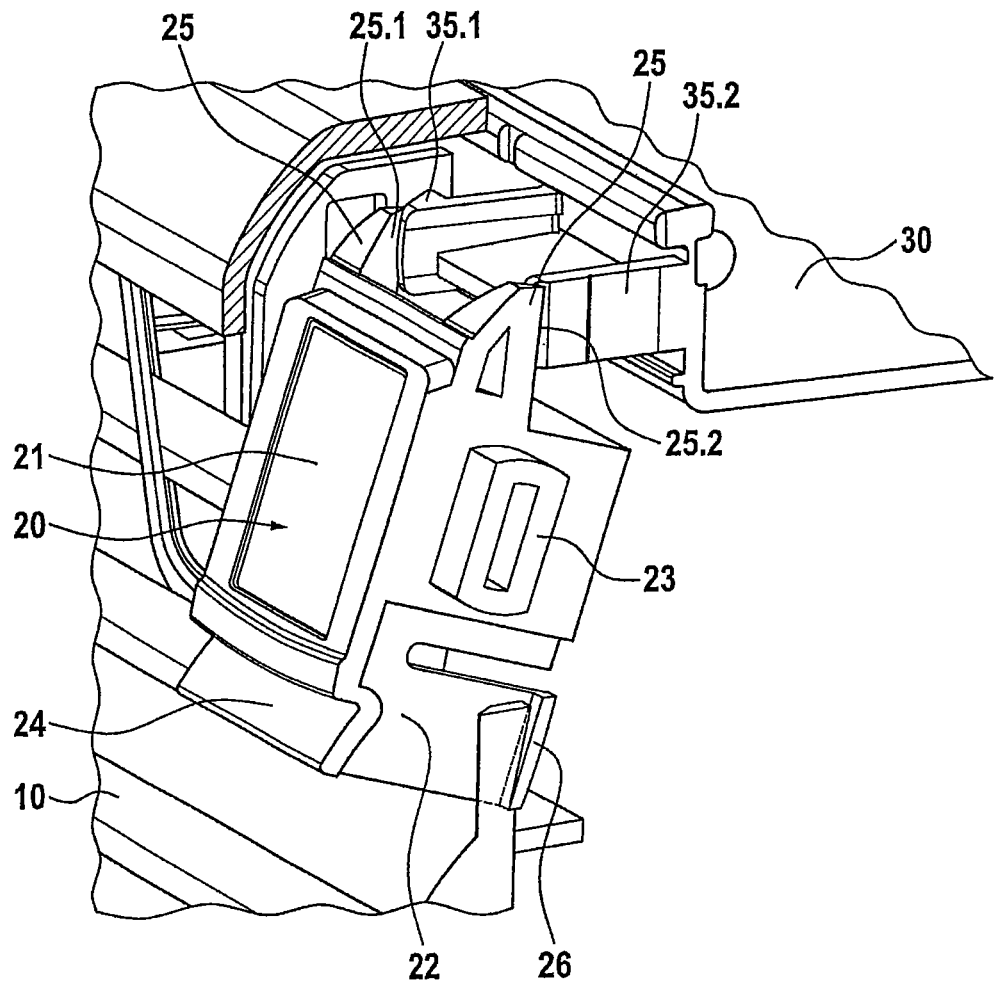
FIG. 9 a perspective view of the air passage grating of FIG. 1 and the air guidance housing of FIG. 7 with the handle of FIGS. 3-6 in the unlocking position.
Figure 10:
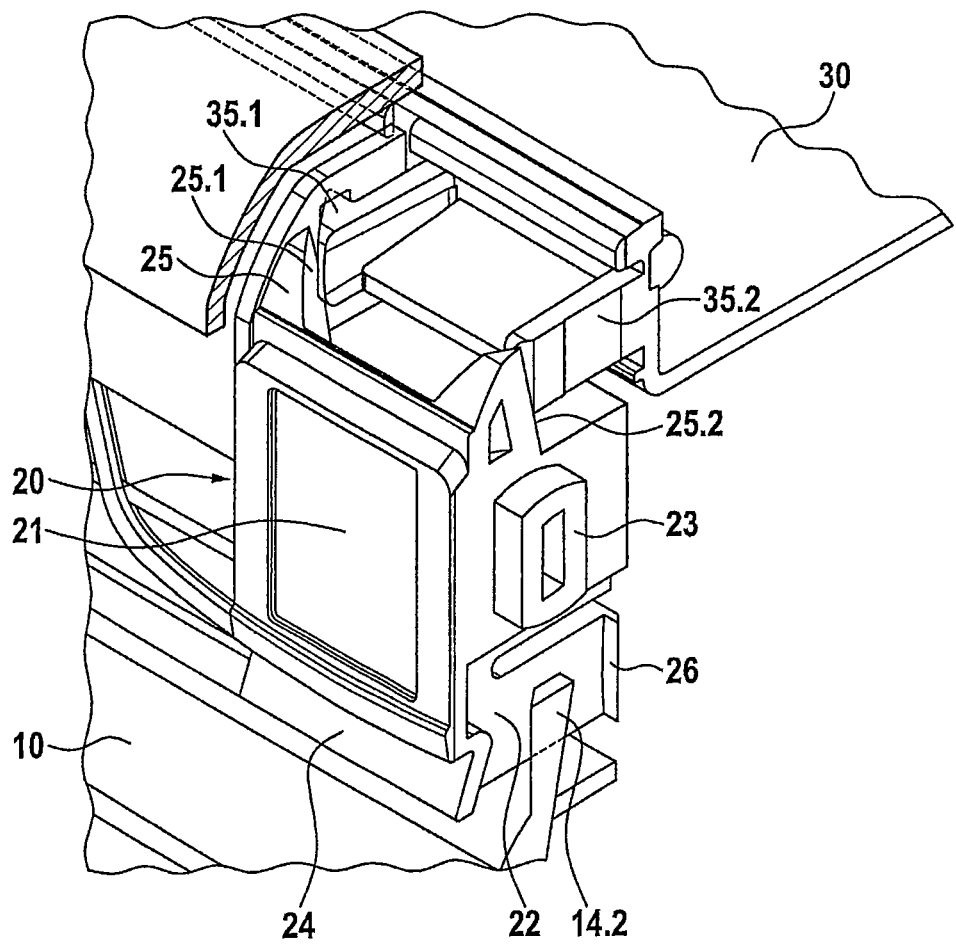
FIG. 10 a perspective view as in FIG. 9, with the handle in the locking position.

The building unit comprised of air passage grating 10 and handle 20 may be connected to the air guiding housing according to FIG. 7. Air guiding housing 30 comprises a continuous housing wall 31, which is closed by a button 33. Button 33 is penetrated by an air passage opening 32. Housing wall 31 is provided with an outwardly extending continuous flange 36. A locking assembly with two latches 35 is integrally formed to the air guiding housing 30 in the region of its upper horizontal edge. Latches 35 are equipped with spring elements 35.2 which are formed as lobes to flange 36. At their free ends, spring elements 35.2 carry snap-in shoulders 35.1. Two hinge elements 34 are formed to the lower horizontal edge of air guidance housing 30.

For connecting air passage grating 10 with air guidance housing 30, hinge seat 13 of air passage grating 10 are snapped into hinge elements 34. Thus, a hinge connection having a horizontal pivot axis is formed, about which air passage grating 10 may be pivoted. Air passage grating 10, starting from an opened maintenance position, in which the interior of the air guidance housing 30 is accessible, may be brought in a folded-up mounting position. When folding up air passage grating 10, latches 35 reach the region of closure seat 14 and snap into snap-lock seats 14.5. Now, air passage grating 10 is securely fixed. For re-opening, handle 20 must be grasped at handle section 24 and pivoted away. Thereby, approach slopes 25.1 of handle 20 slide on inclined snap-lock faces of snap-lock shoulders 35.1. Then, latches 35 are deflected in spring elements 35.2 and moved towards another. They are disengaged from snap-lock seats 14.5. If pivoting of handle 20 is further proceeded with, press-off piece 25.2 of actuator elements 25 impinges on the front of flange 36 of air guidance housing 30. Thus, air passage grating 10 may be moved apart from air guidance housing 30. A gap results where air passage grating 10 may be grasped and can be folded up.

The invention claimed is:

1. An air guidance system having an air guidance housing and an air passage grating fastened thereto, the air passage grating being held on the air guidance housing by means of a snap-lock connection, wherein the air guidance housing carries at least one latch having a snap-in shoulder that can be engaged in a snap-lock seat of the air passage grating and the air passage grating pivotally accommodates a handle in a bearing seat, said handle disengaging the latch from the snap-lock seat when set from the locking position to the unlocking position such that the air passage grating may be moved apart from the air guidance housing, and wherein the handle carries two bearing tabs forming a common bearing axis which respectively are engaged in the bearing seat, Wherein the handle comprises at least on actuator element forming an approach slope which interacts with a slope of the snap-in shoulder for disengaging the snap-in shoulder such that the snap-in shoulder is deflected, Wherein the air guidance housing carries at least two latches which can be disengaged by means of a respective associated actuator element when operating the handle, Wherein the handle has a press-off piece spaced apart from the pivot axis of the handle, and the press-off piece can be pressed on a press-off face of the air guidance housing for pressing off the air passage grating from the locking position.

2. The air guidance system of claim 1, wherein the handle comprises a stopper abutting at a locking piece of the air passage grating in the unlocking position of the handle.

3. The air guidance system of claim 1, wherein the air passage grating is pivotally coupled to the air guidance housing by means of a hinge connection.

4. The air guidance system of claim 1, wherein the bearing seat comprises snap-lock elements configured such that when the bearing tabs have passed the snap-lock elements and reach the bearing seat, the snap-lock elements snap behind the bearing tabs so that the handle is securely held to the air passage grating.

* * * * *